(12) United States Patent
Tsuda

(10) Patent No.: US 6,839,259 B2
(45) Date of Patent: Jan. 4, 2005

(54) CONTENT ADDRESSABLE MEMORY DEVICE FOR COMPENSATING FAULTS

(75) Inventor: Tomoo Tsuda, Mihama-ku (JP)

(73) Assignee: Kawasaki Microelectronics, Inc., Chiba (JP)

(*) Notice: Subject to any disclaimer, the term of this patent is extended or adjusted under 35 U.S.C. 154(b) by 38 days.

(21) Appl. No.: 10/440,307

(22) Filed: May 19, 2003

(65) Prior Publication Data

US 2004/0105318 A1 Jun. 3, 2004

(30) Foreign Application Priority Data

May 20, 2002 (JP) ........................................ 2002-144832

(51) Int. Cl.$^7$ .............................................. G11C 15/00
(52) U.S. Cl. ...................... 365/49; 365/189.08; 365/200
(58) Field of Search .................... 365/199, 49, 189.008, 365/189.07, 200; 711/108

(56) References Cited

U.S. PATENT DOCUMENTS

2003/0227801 A1 * 12/2003 Battaglia ..................... 365/200
2004/0085825 A1 *  5/2004 Narita et al. ................ 365/200

FOREIGN PATENT DOCUMENTS

JP         2000-030487         1/2000

OTHER PUBLICATIONS

A 1–Mb 2–TR/b Nonvolatile CAM Based on Flash Memory Technologies, Tohru Miwa, Hachiro Yamada, Yoshinori Hirota, Toshiya Satoh, and Hideki Hara, 1996 IEEE.

* cited by examiner

Primary Examiner—Son T. Dinh
Assistant Examiner—Hien Nguyen
(74) Attorney, Agent, or Firm—Oliff & Berridge, PLC

(57) ABSTRACT

A content addressable memory device includes a plurality of memory banks. A faulty memory bank, if present, is excluded from the memory capacity thereof so that the content addressable memory device is used with the memory capacity thereof reduced. The content addressable memory device includes a plurality of banks, each bank including a plurality of words for storing data, an excluded bank information memory for storing information concerning an excluded bank, a mapping circuit for mapping an enable signal designating a bank to a bank other than the excluded bank, based on the excluded bank information, and a demapping circuit for mapping, to bank addresses including the address of the excluded bank, a hit signal representing that a word storing data corresponding to input search data is present in its own bank.

10 Claims, 11 Drawing Sheets

CONTENT ADDRESSABLE MEMORY DEVICE FOR COMPENSATING FAULTS

BACKGROUND OF THE INVENTION

1. Field of the Invention

The present invention relates to a content addressable memory device including a plurality of memory banks and, in particular, to a content addressable memory device that excludes a faulty memory bank.

2. Description of the Related Art

A content addressable memory (hereinafter referred to as CAM) device has been in widespread use. The CAM device includes a plurality of memory words (hereinafter simply referred to as words) for storing data, receives search data, and searches for a word storing data corresponding to the input search data. Typically, redundant words in reserve are arranged in CAM devices, and if and when a faulty word containing a defective element is found in a shipping inspection, the CAM device is treated as a good product with the faulty word replaced with the reserved word. In this way, the manufacturing yield of the CAM devices is heightened.

For example, a CAM device technique having a plurality of reserved words is proposed in a paper entitled "A 1-Mb 2-Tr/b Nonvolatile CAM Based on Flash Memory Technologies" authored by Tohru Miwa et al. IEEE JOURNAL OF SOLID-STATE CIRCUITS, VOL. 31, NO. 11, NOVEMBER 1996 pp. 1601–1608.

In the disclosed technique, if one faulty word is present, the address of the fault word is memorized. If an address input, from the outside, to write data to or to read data from a word is equal to or larger than the address of the fault word, 1 is added to the input address. The resulting address is then output to an address decoder. If an address of a word hit during a search operation is larger than the address of the faulty word, 1 is subtracted from the address. The resulting address is output to the outside.

Japanese Patent Application Publication No. 2000-30487 discloses a dynamic RAM including a number of banks, each bank containing redundant elements for covering a faulty element. The RAM includes a bank enable register that stores the information of a bank that is not rescued because the number of faulty elements is larger than the number of redundant elements. The dynamic RAM is shipped as a mostly good memory. A predetermined number of such RAMs are combined forming a memory module. A memory controller is then arranged, which reads the content of each bank enable register, and assigns addresses to respective banks while excluding the unrescued banks from address assignment.

But, with the above disclosed techniques, the CAM device cannot be rescued if words in excess of the predetermined number of reserved words are detected as faulty. Thus the disclosed techniques fail to lead to a high manufacturing yield of the CAM devices.

In accordance with the technique disclosed in Japanese Patent Application Publication No. 2000-30487, the memory controller is arranged not in the dynamic RAM chip, but as a member of the memory module, which further includes a plurality of dynamic RAM chips. The structure of the memory controller is not specifically disclosed.

Furthermore, the CAM device has an additional feature in the operation thereof. In searching, even an address of a word outputting a match signal needs to be address converted. That is, it is not sufficient to assign the addresses of the fault words to the addresses of the words.

SUMMARY OF THE INVENTION

Accordingly, it is an object of the present invention to provide a CAM device that can reduce the memory capacity thereof by bank even when the CAM device is manufactured with an unrescuable bank contained therewithin.

A content addressable memory device of the present invention includes a plurality of banks, each bank including a plurality of words for storing data, an excluded bank information memory for storing information concerning an excluded bank, a mapping circuit for mapping an enable signal designating a bank to a bank other than the excluded bank, based on the excluded bank information, and a demapping circuit for mapping, to bank addresses including the address of the excluded bank, a hit signal representing that a word storing data corresponding to input search data is present in its own bank.

Even when the CAM device contains faulty banks, addresses of the faulty banks are mapped to banks other than the faulty banks. Subsequent to a searching for the word with input search data, the CAM device maps, to bank addresses including addresses of the faulty banks, a hit signal indicating that a word storing data corresponding to the input search data, if any, is present in its own bank. This overcomes the drawback that a CAM chip or a bank having faulty words in excess of the number of predetermined reserved words remains unrescuable. Furthermore, even when the CAM device contains no faulty elements, the apparent memory capacity thereof is easily reduced, if necessary.

DESCRIPTION OF THE PREFERRED EMBODIMENTS

The embodiments of the present invention is described below.

Figure 1:
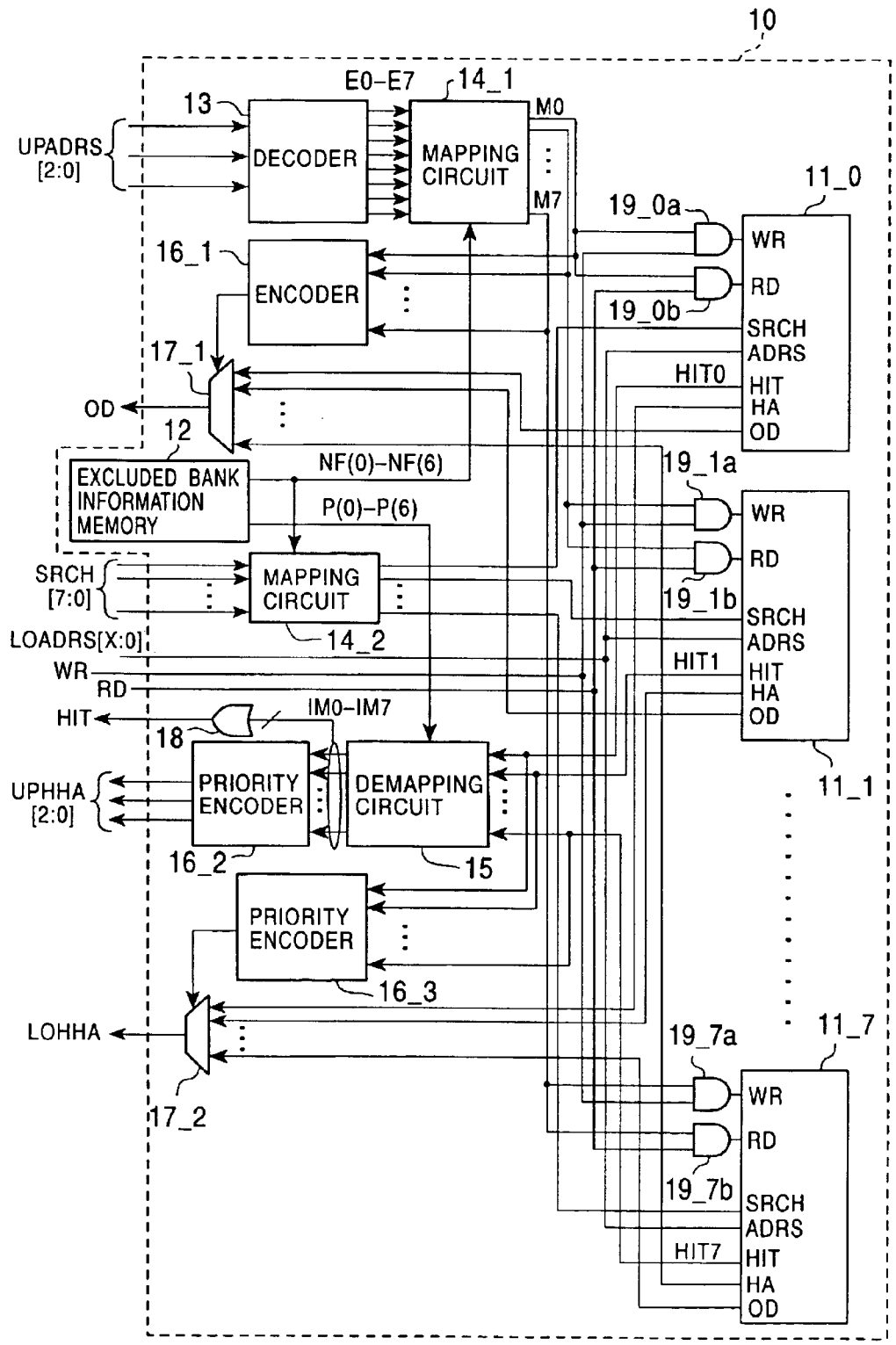
FIG. 1 is a block diagram of the CAM device in accordance with a first embodiment of the present invention.

FIG. 1 is a block diagram of a CAM device 10 in accordance with a first embodiment of the present invention.

As shown, the CAM device 10 includes eight physical memory banks (hereinafter simply referred to as banks) 11_0, 11_1, . . . 11_7 each bank having a plurality of words.

Figure 2:
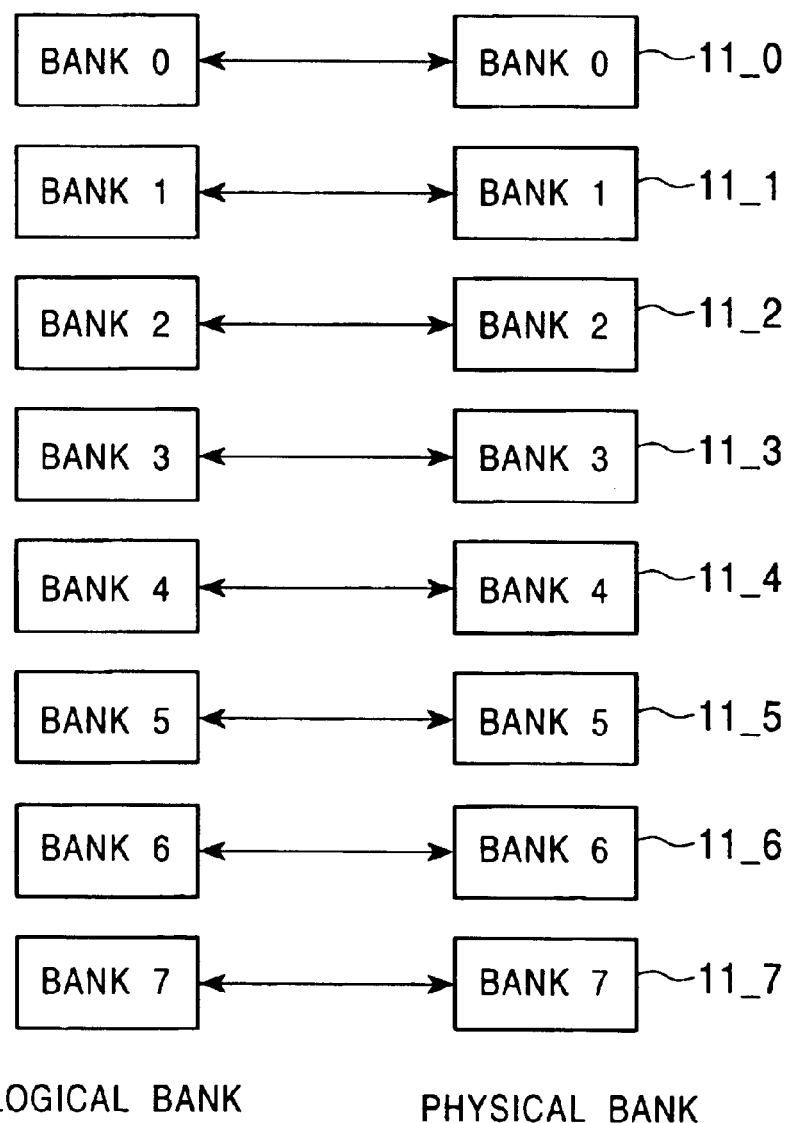
FIG. 2 shows the correspondence between logical banks and physical banks with all eight physical banks being good.
Figure 3:
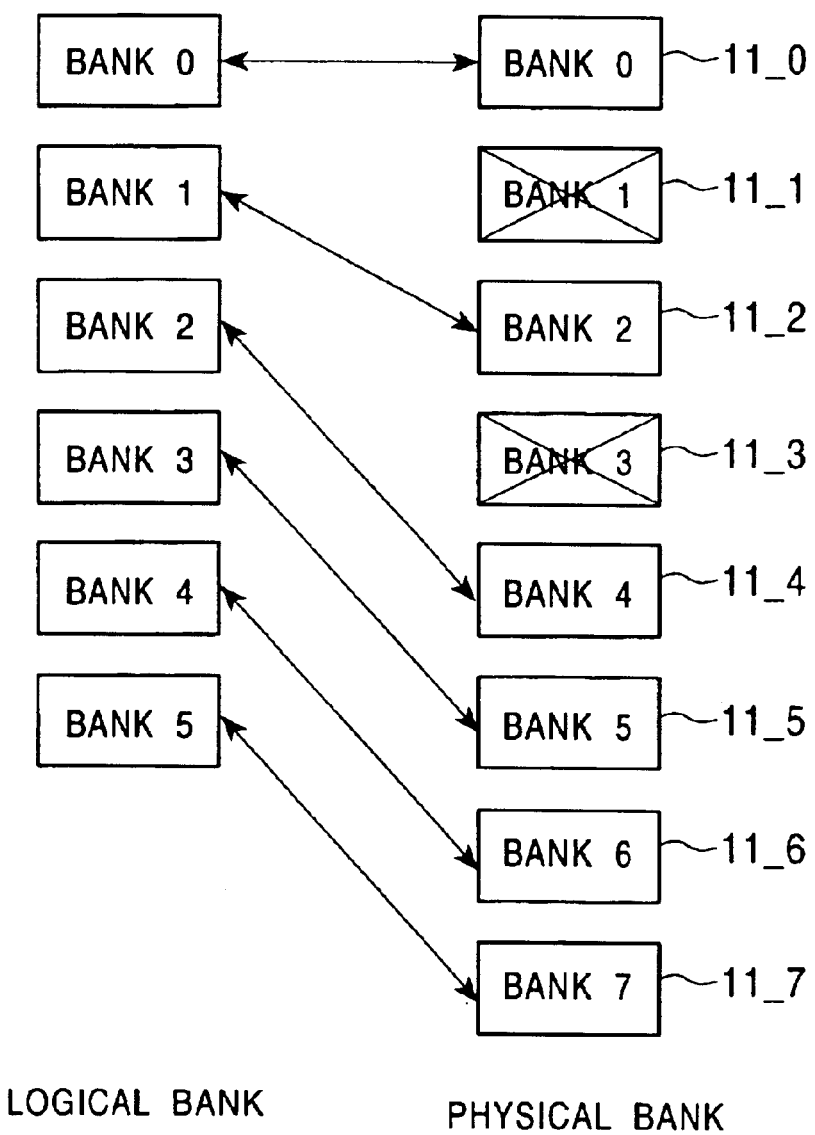
FIG. 3 shows the correspondence between logical banks and physical banks with two out of the eight physical banks excluded.

FIG. 2 shows the correspondence between logical banks and physical banks with all eight physical banks being good. FIG. 3 shows the correspondence between logical banks and physical banks with two out of the eight physical banks being faulty.

Referring to FIG. 2, the logical banks BANK 0 through BANK 7 are mapped to the physical banks 11_0, 11_1, . . . , 11_7 on a one-to-one correspondence basis if the physical banks 11_0, 11_1, . . . , 11_7 have no faulty words, or are rescuable with the redundant words even when faulty words are present therewithin. If two physical banks 11_1 and 11_3 are unrescuable as shown in FIG. 3, the logical bank BANK 0 is mapped to the physical bank 11_0, and the logical bank BANK 1 is mapped to the physical bank 11_2. The logical banks BANKs 2, 3, 4, and 5 are mapped to the physical banks 11_4, 11_5, 11_6, and 11_7, respectively.

Each bank of the present invention includes an in-bank address decoder that decodes a word address in the bank (i.e., a lower bit LOADRS[X:0], X is an integer), and generates an access signal of a word designated by that address; a control circuit that receives signals output from AND gates of a bank enable signal from a mapping circuit 14_1 and a command signal (WR or RD) from the outside, and a signal SRCH commanding a search operation, and controls the operation of the bank; a drive circuit that receives write data and search data, and drives data to a data bit line and a search bit line; a data outputs circuit that output data stored in each word; and a priority encoder that outputs, at a terminal HA thereof, an in-bank address of a word having a first priority if there are a plurality of words in the bank corresponding to input search data.

As shown in FIG. 3, two physical banks 11_1 and 11_3 are here assumed to be faulty.

The CAM device 10 shown in FIG. 1 includes an excluded bank information memory 12 that stores excluded bank information designating the physical banks 11_1 and 11_3 to be excluded. The excluded bank information memory 12 will now be discussed in detail with reference to FIG. 4.

Figure 4:
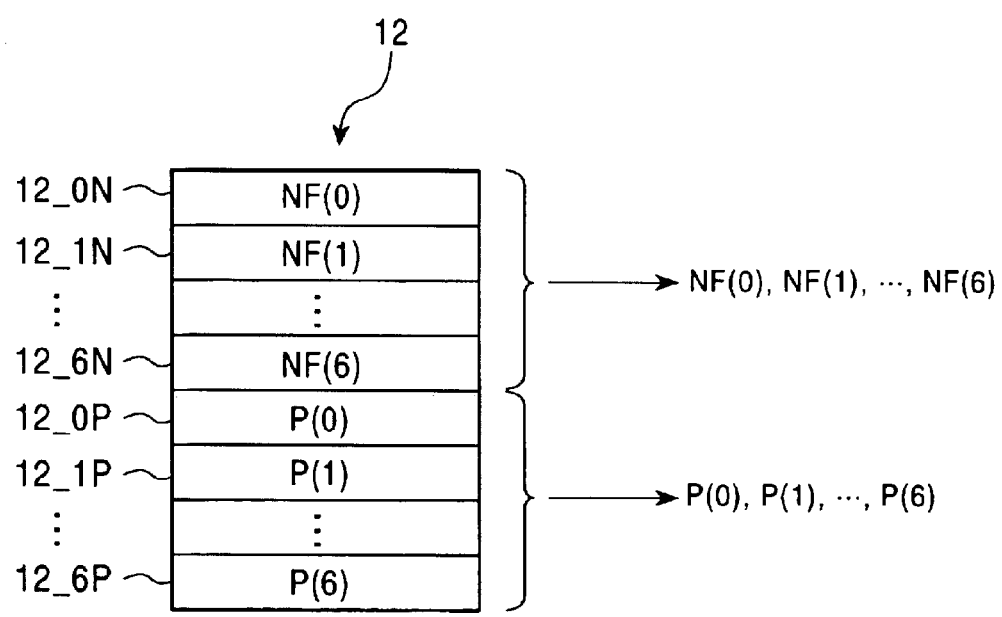
FIG. 4 shows an excluded bank information memory of the CAM device of FIG. 1.

FIG. 4 shows an excluded bank information memory 12 of the CAM device of FIG. 1.

As shown, the excluded bank information memory 12 includes fuse sections 12_0N, 12_1N, . . . , 12_6N. Excluded bank information NF(0)–NF(6) is determined in accordance with the open and close state of each fuse section. The excluded bank information NF(k) here represents the number of excluded banks equal to or smaller than the physical bank number k. Let L(n) represent a logical bank number corresponding to the physical bank n, and the following equation holds:

$$L(k)=k-NF(k)$$

The excluded bank information memory 12 further includes fuse sections 12_0P, 12_1P, . . . , 12_6P. The physical bank numbers P(0)–P(6) are determined in accordance with the open and close state of each fuse section. Here, the physical bank number P(0) represents a first good bank (i.e., bank 11_0). The physical bank number P(k) represents the minimum and good bank larger than the physical bank P(k-1) (i.e., a good bank next to the one excluded). As shown in FIG. 3, for example, P(0)=0, P(1)=2, P(2)=4, P(3)=5, P(4)=6, P(5)=7. In other words, P(k) represents a physical bank corresponding to a logical bank k. Returning to FIG. 1, the discussion of the first embodiment continues.

The CAM device 10 shown in FIG. 1 further includes a bank address decoder (hereinafter simply referred to as a decoder) 13 that receives upper three bits of the address UPADRS [2:0] corresponding to the number of physical banks, namely 8, and a mapping circuit 14_1 that receives signals E0–E7 decoded by the decoder 13. The mapping circuit 14_1 maps the enable signals E0–E7 designating the banks 11_0, 11_1, . . . , 11_7 to the banks except banks 11_1 and 11_3 (see FIG. 3) in accordance with the excluded bank information NF(0)–NF(6) output from the excluded bank information memory 12. The mapping circuit 14_1 will now be discussed with reference to FIG. 5.

Figure 5:
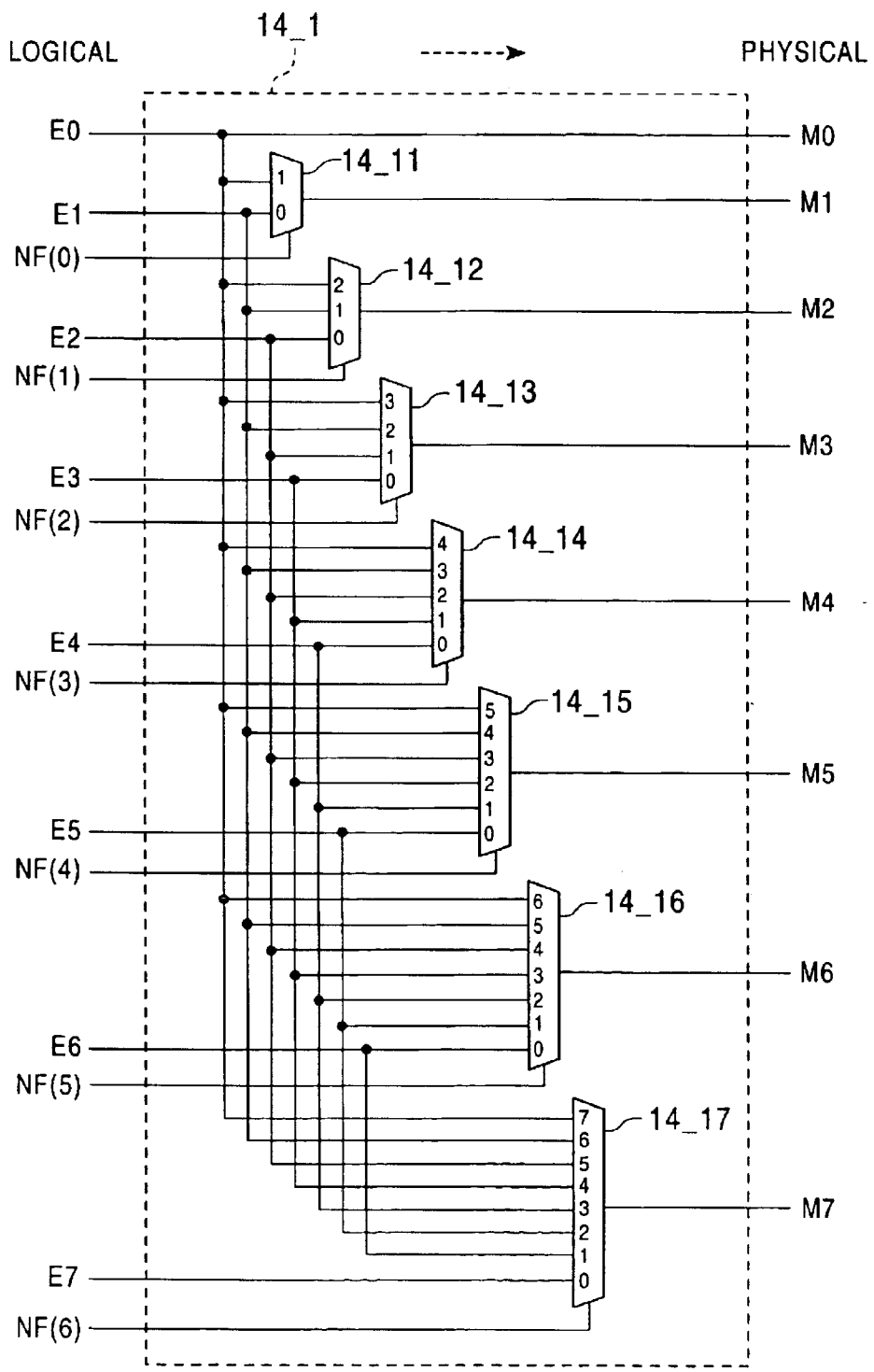
FIG. 5 is a circuit diagram of a mapping circuit of the CAM device of FIG. 1.

FIG. 5 is a circuit diagram of the mapping circuit 14_1 of the CAM device of FIG. 1.

The mapping circuit 14_1 shown in FIG. 5 includes seven selectors 14_11, 14_12, . . . , 14_17. If only the bank 11_1 is excluded, the excluded bank information NF(0) becomes 0, and the bank information NF(3)–NF(6) become 1. If only the bank 11_3 is excluded, excluded bank information NF(0)–NF(2) become 0, and NF(3)–NF(6) become 1. Since banks 11_1 and 11_3 are excluded here, NF(0)=0, NF(1)=NF(2)=1, and NF(3)–NF(6)=2. Since there are six good banks, addresses for designating the logical banks 0–5 are input as address UPADRS[2:0]. For example, if an address for designating the logical bank 5 is input as the address UPADRS[2:0], the decoder 13 outputs a decoded signal E5. The decoded signal E5 is supplied to each of a terminal 0 of the selector 14_15, a terminal 1 of the selector 14_16, and a terminal 2 of the selector 14_17. The selector 14_17 outputs the decoded signal E5 as a mapping signal M7 in response to the excluded bank information NF(6) having a value 2. Then if the address for designating the logical bank 5 is input, the bank 11_7 is designated.

Furthermore, as shown in FIG. 1, a lower address LOADRS[X:0] is input to each of all banks including the bank 11_7. Corresponding to these banks 11_0, 11_1, . . . , 11_7, a pair of write AND gate 19_0a and read AND gate 19_0b, . . . , a pair of write AND gate 19_7a and read AND gate 19_7b are arranged. To write data on a word belonging to the bank 11_7, the bank 11_7 is designated as discussed above, the word is designated using the lower address LOADRS[X:0], and a write signal WR is input to the bank 11_7 through the AND gate 19_7a. To read data from the word in the bank 11_7, the bank 11_7 is designated as discussed above, the word is designated using the lower address LOADRS[X:0], and a read signal RD is input to the bank 11_7 through the AND gate 19_7b.

In this way, data is output from an output data terminal OD of the bank 11_7 to the data selector 17_1. Since the mapping signal M7 is supplied to the encoder 16_1, the data of the bank 11_7 is output through the selector 17_1.

Next, the operation of the CAM device 10 shown in FIG. 1 to search for a word storing data corresponding to the input search data is discussed below. The CAM device 10 includes a mapping circuit 14_2 identical in structure to the mapping circuit 14_1. The mapping circuit 14_2 is supplied with bit map data SRCH[7:0] for designating a bank desired to be searched. If the search result of the word in the bank designated by the mapping circuit 14_2 shows a match with the input search data, a hit flag HIT representing the match and a hit address HA are output. The hit flag HIT is input to each of a demapping circuit 15 and a priority encoder 16_3, and the hit address HA is input to the selector 17_2. The demapping circuit 15 will now be discussed with reference to FIG. 6.

Figure 6:
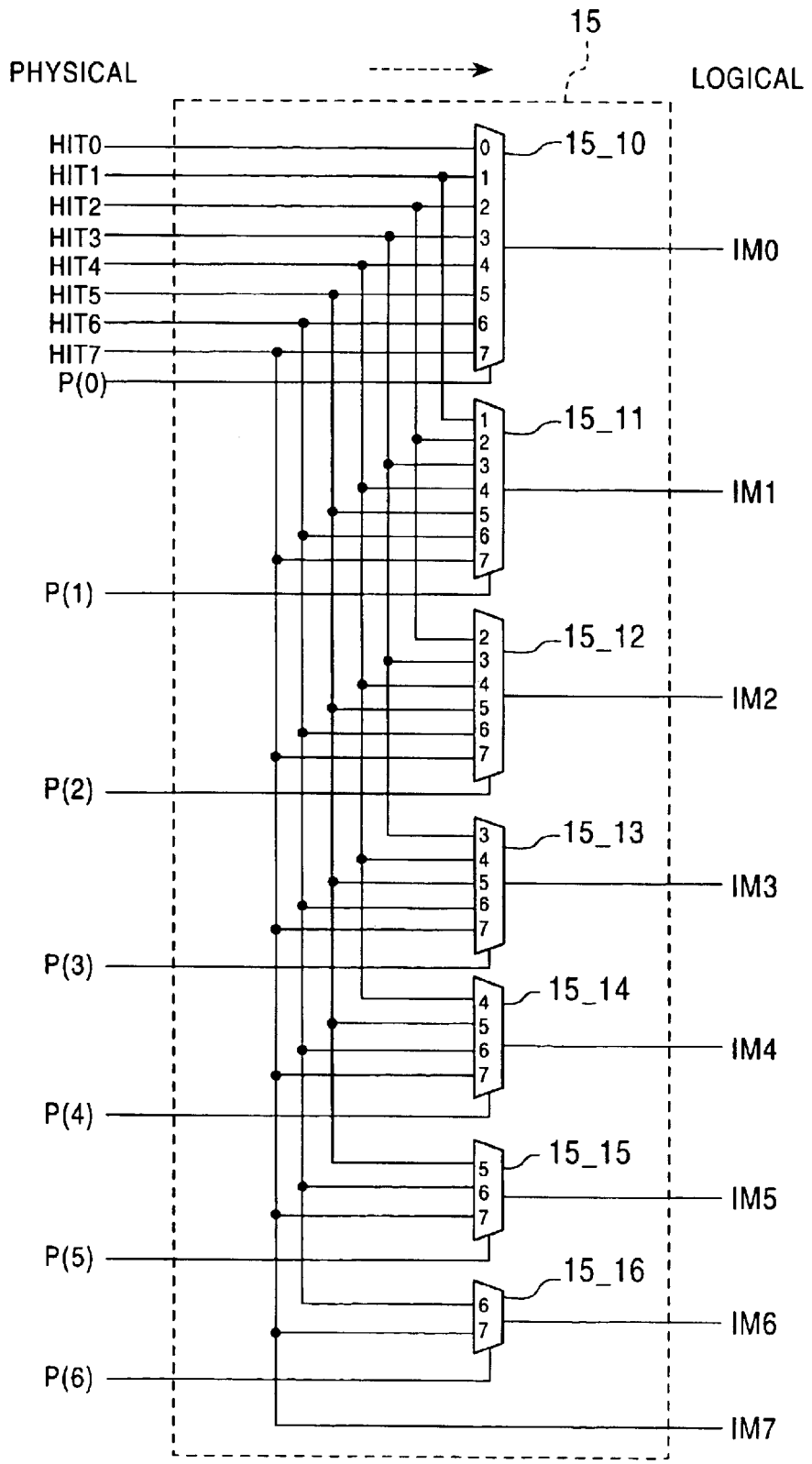
FIG. 6 is a circuit diagram of a demapping circuit of the CAM device of FIG. 1.

FIG. 6 is a circuit diagram of the demapping circuit 15 of the CAM device 10 of FIG. 1.

The demapping circuit 15 shown in FIG. 6 includes seven selectors 15_10, 15_11, . . . , 15_16. The demapping circuit 15 receives hit signals HIT0, . . . , HIT7 from the banks 11_0, . . . , 11_7, respectively. The demapping circuit 15 also receives the physical bank numbers P(0)–P(6) from the excluded bank information memory 12. The demapping circuit 15 maps the hit signals HIT0–HIT7, representing whether a word storing data corresponding to the input search data is present in its own bank (for example, '1' if present in the bank, and '0' if not present in the bank), to the banks having bank addresses including the bank addresses representing the faulty physical banks 11_1 and 11_3.

Specifically as shown in FIG. 3, the banks 11_1 and 11_3 are excluded, thus the physical bank number P(0) for the logical bank 0 is 0, the physical bank number P(1) for the logical bank 1 is 2, the physical bank number P(2) for the logical bank 2 is 4, the physical bank number P(3) for the logical bank 3 is 5, the physical bank number P(4) for the logical bank 4 is 6, and the physical bank number P(5) for the logical bank 5 is 7.

For example, if the hit signal HIT7 of '1' is output from the bank 11_7, this signal is input to the terminals 7 of the selectors 15_10 through 15_16. The selector 15_15 outputs a demapped signal IM5 because the physical bank number P(5) having a value 7 is input to the selector 15_15. The demapped signal IM5 is input to a priority encoder 16_2. The priority encoder 16_2 outputs an upper hit address UPHHA[2:0] that designates the logical bank 5 corresponding to the input demapped signal IM5. The bank 11_7 outputs a lower hit address HA to the selector 17_2. Since the priority encoder 16_3 receives the hit signal HIT7, the selector 17_2 outputs the hit address HA of the bank 11_7 as a lower hit address LOHHA. The demapped signal IM5 from the demapping circuit 15 is input to an OR gate 18. In this way, the information that there is a hit is thus transmitted to the outside.

Therefore, even if the CAM device 10 of the first embodiment has faulty physical banks 11_1 and 11_3, the faulty physical banks 11_1 and 11_3 are mapped to the other banks. Subsequent to the search with input search data, the CAM device 10 maps the hit signal, representing that the word storing the data corresponding to the input search data is present in its own bank, to the logical address 0–5 including the original logical addresses of the banks including the faulty banks 11_1 and 11_3. This arrangement overcomes the drawback that a CAM chip or a bank having faulty words in excess of the number of predetermined reserved words remains unrescuable. The mapping circuits 14_1, 14_2 and the demapping circuit 15 have a simple circuit arrangement as shown in FIGS. 5 and 6. With the scale of the circuit of the CAM device 10 maintained, the manufacturing yield of the device is heightened.

Next, a CAM device of a second embodiment of the present invention will now be discussed. In comparison with the CAM device 10 of the first embodiment, the CAM device of the second embodiment includes an excluded bank information memory 22 instead of the excluded bank information memory 12.

Figure 7:
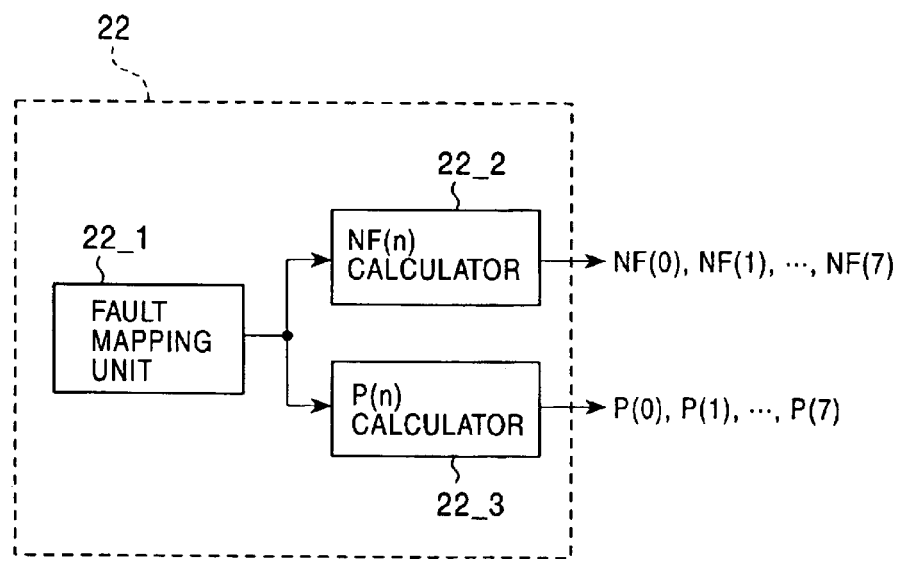
FIG. 7 is a block diagram of an excluded bank information memory in the CAM device in accordance with a second embodiment of the present invention.

FIG. 7 is a block diagram of the excluded bank information memory 22 arranged in the CAM device of the second embodiment.

As shown, the excluded bank information memory 22 includes a fault mapping unit 22_1, an NF(n) calculator 22_2, and a P(n) calculator 22_3.

The fault mapping unit 22_1 includes fuses arranged in a bit map structure representing excluded information of each bank. The excluded bank is thus determined according to the open or close state of a fuse. In the second embodiment, the NF(n) calculator 22_2 calculates the excluded bank information NF(0)–NF(7) in accordance with the fault map data from the fault mapping unit 22_1, while the P(n) calculator 22_3 calculates the physical bank numbers P(0)–P(7). The NF(n) calculator 22_2 and the P(n) calculator 22_3 will now be discussed with reference to FIGS. 8, 9, 10, and 11.

Figure 8:
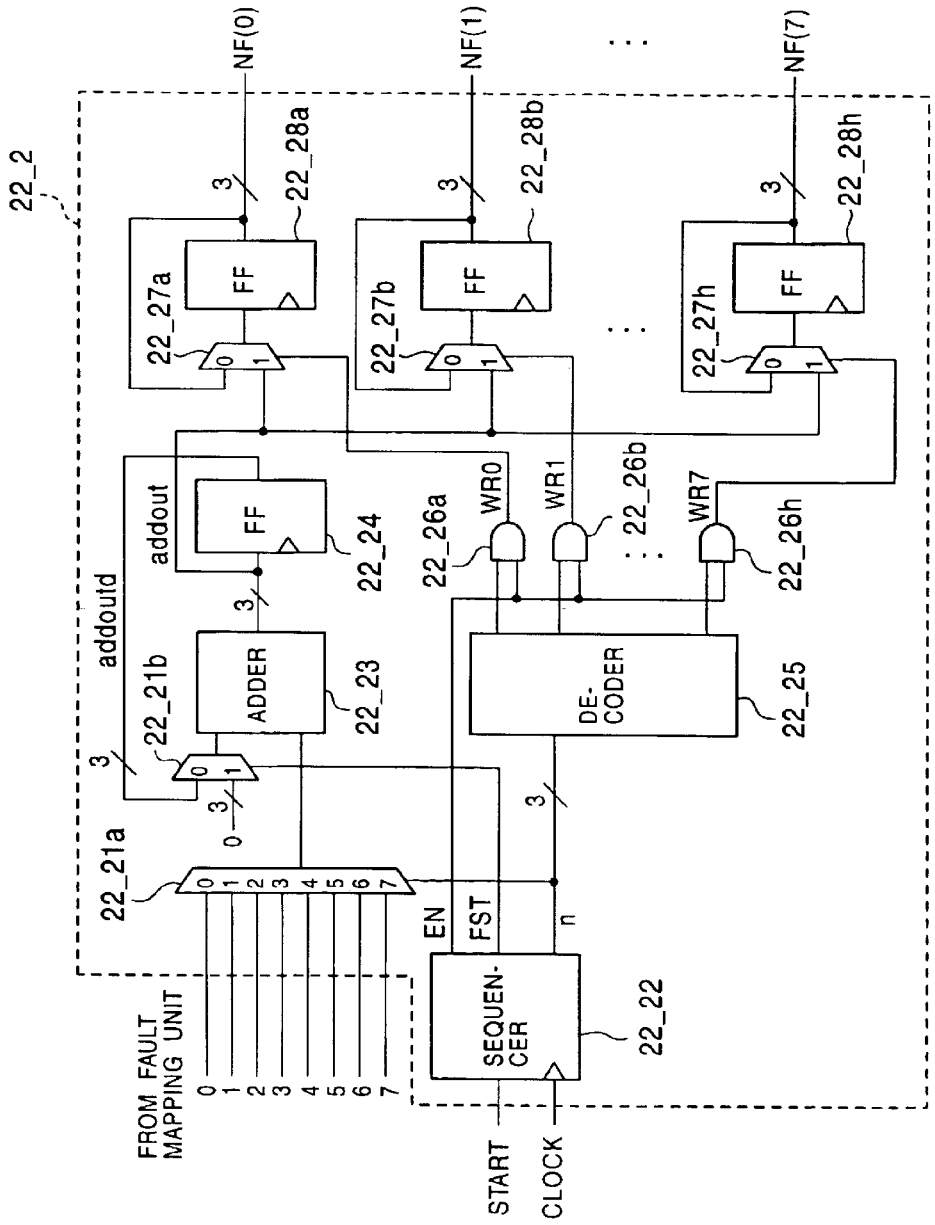
FIG. 8 is a circuit diagram of an NF(n) calculator of the CAM device of FIG. 7.
Figure 9:
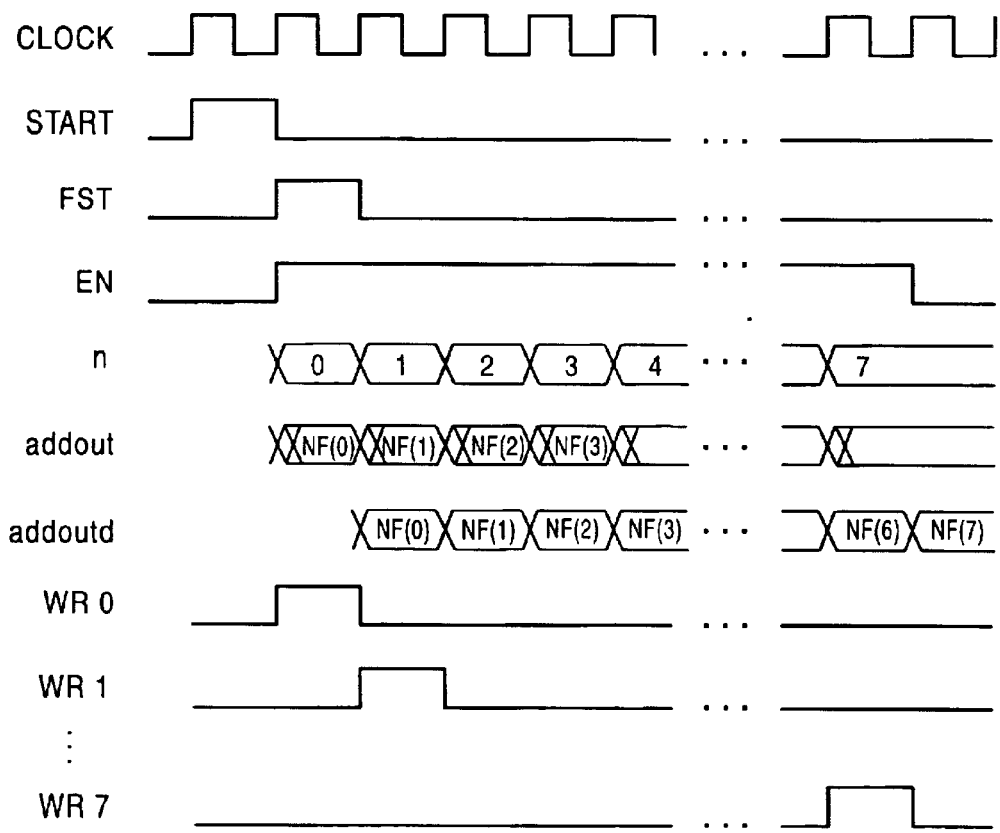
FIG. 9 is a timing diagram of the NF(n) calculator of FIG. 8.

FIG. 8 is a circuit diagram of the NF(n) calculator 22_2 of the CAM device of FIG. 7. FIG. 9 is a timing diagram of the NF(n) calculator 22_2 of FIG. 8.

A selector 22_21a in FIG. 8 receives the fault map data 0–7 from the fault mapping unit 22_1. The fault map data 0–7 is bit map data that represents whether or not to exclude each bank. If fault map data n is "1", the corresponding bank n is excluded. A sequencer 22_22 receives a clock signal CLOCK and a start signal START.

In response to the input signal START shown in FIG. 9, the sequencer 22_22 outputs a start signal FST that remains high for one period of the signal CLOCK by recognizing that the signal START is at a high level at the rising edge of the signal CLOCK, and a high-level enable signal EN. The start signal FST is input to a selector 22_21b as a selecting signal. The selector 22_21b then outputs three bit zero values, thereby initializing an adder 22_23.

The sequencer 22_22 successively outputs data (n=0, . . ., 7) forming a three bit signal n, to which 1 is added at each rising edge of the signal CLOCK. The three bit signal n is input to a selector 22_21a and a decoder 22_25. In response to the data n from the sequencer 22_22, the selector 22_21a selects and then outputs the fault map data 0–7 (a value of the fault map data corresponding to a faulty bank is "1") to the adder 22_23. The adder 22_23 adds data addoutd (0 when n=0) fed back through a flipflop 22_24 and the selector 22_21b and data from the selector 22_21a, thereby outputting data addout. The data addout is input to each of selectors 22_27a, 22_27b, . . . , 22_27h.

The decoder 22_25 decodes input data n, and outputs the decoded data to each of AND gates 22_26a, 22_26b, . . . , 22_26h. Each of the AND gates receives the decoded data from the decoder 22_25 and the enable signal EN, thereby generating write signal WR0, WR1, . . . , WR7.

A flipflop 22_28a recognizes the write signal WR0 at the timing of rising edge of the signal CLOCK, and then stores the data addout (the excluded bank information NF(0) here) from the adder 22_23 through the selector 22_27a. Likewise, fliflops 22_28b, . . . , 22_28h successively store the excluded bank information NF(1), . . ., NF(7). In this way, the NF(n) calculator 22_2 calculates the excluded bank information NF(0)–NF(7).

Figure 10:
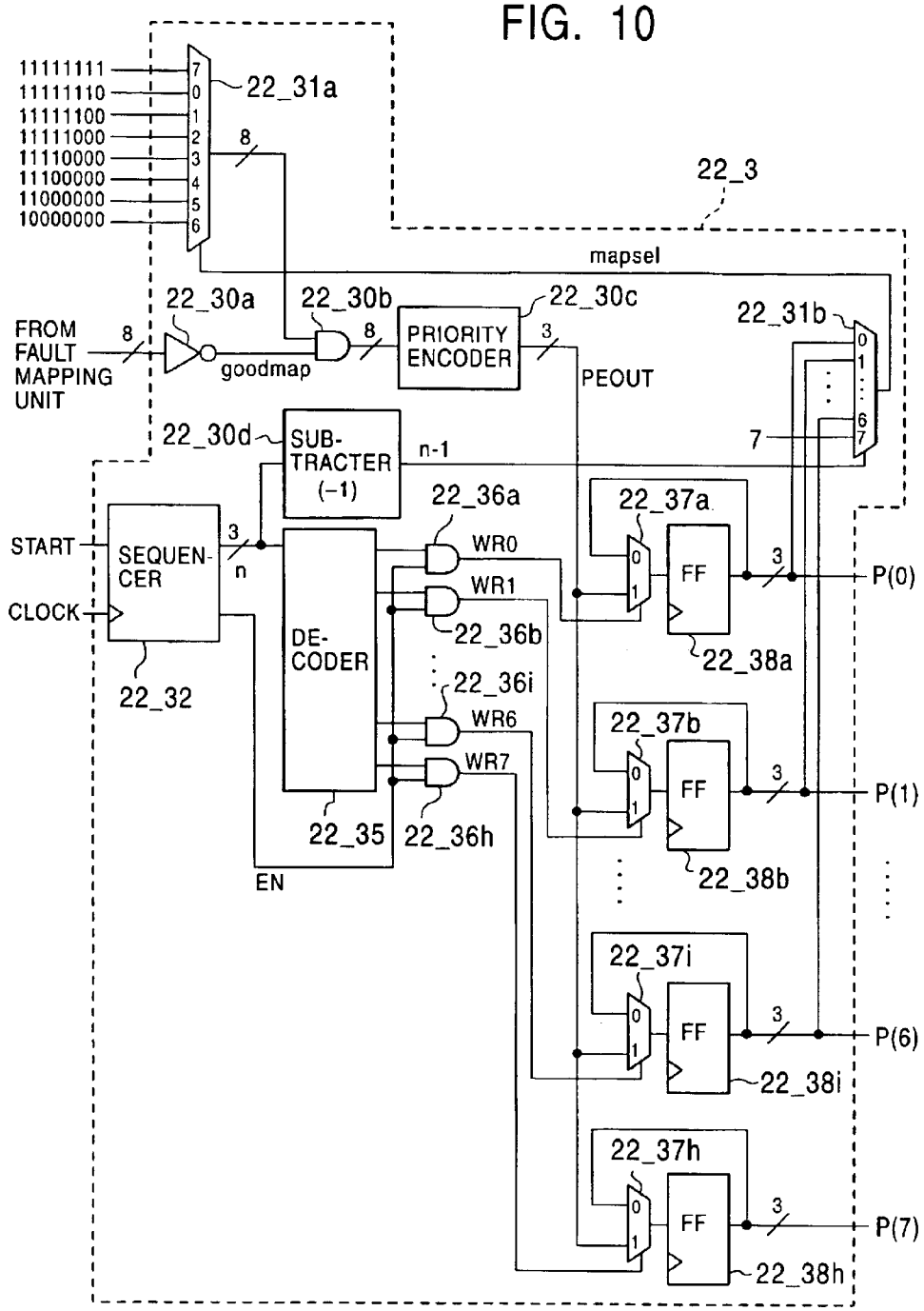
FIG. 10 is a circuit diagram of a P(n) calculator of the CAM device of FIG. 7.
Figure 11:
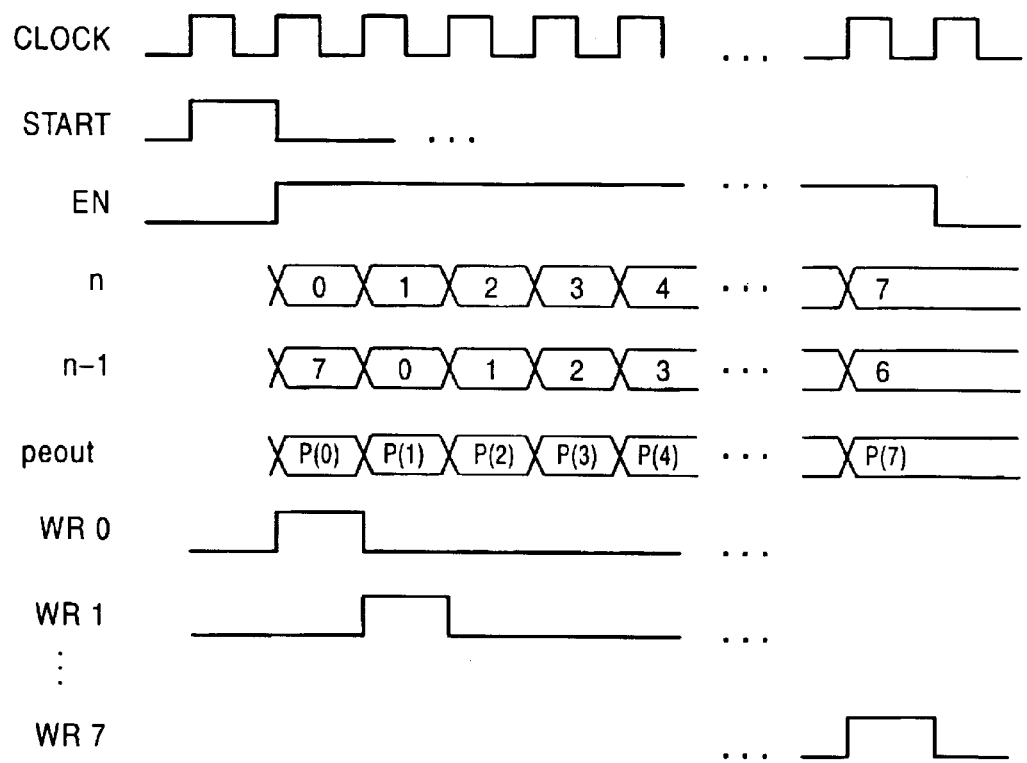
FIG. 11 is a timing diagram of the P(n) calculator of FIG. 10.

FIG. 10 is a circuit diagram of the P(n) calculator 22_3 of the CAM device of FIG. 7, and FIG. 11 is a timing diagram of the P(n) calculator 22_3 of FIG. 10.

An inverter 22_30a in the P(n) calculator 22_3 shown in FIG. 10 receives the bit map data 0–7 from the fault mapping unit 22_1. The selector 22_31a receives a 8-bit constant. A sequencer 22_32 receives the signal CLOCK and the signal START.

Upon receiving the signal START at a high level shown in FIG. 11, the sequencer 22_32 outputs the high-level enable signal EN at the rising edge of the signal CLOCK. The sequencer 22_32 further outputs the signal n (n=0, . . . , 7), to which 1 is added at each rising edge of the signal CLOCK. The signal n is input to each of a subtracter 22_30d and a decoder 22_35. The subtracter 22_30d decrements input signal n, thereby generating signal n−1 of data 7, 0, 1, . . . , 6. The signal n−1 becomes a selecting signal of the selector 22_31b. The selector 22_31b thus outputs the physical bank number P(n−1) as a map selecting signal mapsel (when n−1=7, the constant becomes 7). The decoder 22_35 decodes the signal n, which are then logically operated with the high-level enable signal EN at the AND gates 22_36a, 22_36b, . . . , 22_36i and 22_36h. The write signals WR0, WR1, . . . , WR7 are thus generated.

The bit map data 0–7 input to the inverter 22_30a indicates the exclusion of each bank by "1". The inverter 22_30a inverts this logic, thereby becoming good map (goodmap) data that indicates that a logical "1" represents a good bank.

In response to the signal mapsel as the selecting signal, the selector 22_31a selects and outputs an 8-bit constant. This output is bit map data designating, as "1", a bank having the physical bank number larger than the physical bank number P(n−1). The bit map data and the good map data are logically operated by an AND gate 22_30b. The result is bit map data designating a good bank having the number larger than the physical bank number P(n−1). The bit map data is then encoded by a subsequent priority encoder 22_30c. The encoded data is a minimum good physical bank number larger than the physical bank number P(n−1), i.e., the physical bank number P(n). This value is stored in the flipflops 22_38a, 22_38b, . . . , and 22_38i, 22_38h through the selectors 22_37a, 22_37b, . . . , and 22_37i, 22_27h when the selectors respectively recognize the write signal WR0, WR1, . . . , WR6, and WR7 at the timing of rising edge of the signal CLOCK. In this way, the P(n) calculator 22_3 calculates the physical bank number P(0)–P(7).

The present invention thus provides the CAM device which is manufactured at high yield without the need for enlarging the scale of the circuit thereof. Even when no fault element is contained, the apparent memory capacity of the CAM device is easily reduced, if necessary.

What is claimed is:

1. A content addressable memory device comprising:
   a plurality of banks, each bank including a plurality of words for storing data;
   an excluded bank information memory for storing information concerning an excluded bank;
   a mapping circuit for mapping an enable signal designating a bank to a bank other than the excluded bank, based on the excluded bank information; and
   a demapping circuit for mapping, to bank addresses including the address of the excluded bank, a hit signal representing that a word storing data corresponding to input search data is present in its own bank.

2. A content addressable memory device according to claim 1, further comprising a bank address decoder that decodes upper bits of word addresses input from the outside corresponding to the number of banks and outputs decoded signals of the number of banks, wherein the mapping circuit converts the decoded signal into an enable signal designating the bank, based on the excluded bank information.

3. A content addressable memory device according to claim 2, wherein the excluded bank information memory outputs a plurality of signals NF(k) (k=0, . . . n−1, where n is the number of physical banks) representing the number of excluded banks equal to or smaller than a physical bank number k, and a plurality of signals P(k) representing the number of physical banks corresponding to a logical bank number k (k=0, . . . n−1, where n is the number of physical banks).

4. A content addressable memory device according to claim 3, wherein the mapping circuit comprises a plurality of selectors, each selector selecting one of the decoded signals output from the bank address decoder in response to a value of the signal NF(k) working as a selecting signal.

5. A content addressable memory device according to claim 3, wherein the demapping circuit comprises a plurality of selectors, each selector selecting one of hit signals output from the bank in response to a value of the signal P(k) working as a selecting signal.

6. A content addressable memory device according to claim 3, wherein the excluded bank information memory comprises a fault mapping memory unit that stores bit information representing one of "1" and "0" depending on whether or not to exclude each bank, an NF(k) calculator generating the signal NF(k) in accordance with the bit information, and a P(n) calculator for generating the signal P(n) in accordance with the bit information.

7. A content addressable memory device according to claim 2, further comprising a data selector that switches the data outputs of the banks in response to the enable signal from the mapping circuit.

8. A content addressable memory device according to claim 7, further comprising a priority encoder that encodes the output of the demapping circuit and generates an upper address of a word that is hit during searching.

9. A content addressable memory device according to claim 8, further comprising a priority encoder that receives a hit signal output from each bank and outputs a signal designating one of banks according to a predetermined order of priority if the hit signals from a plurality of banks indicate the presence of hit words in respective banks, and a selector that selects and outputs one of in-bank addresses of hit words input from the banks in response to the output signal from the priority encoder working as a selecting signal.

10. A content addressable memory device according to claim 9, further comprising an OR gate that OR gates a plurality of outputs from the demapping circuit, thereby generating a signal that indicates which bank contains a word storing data corresponding search data.

* * * * *